(12) United States Patent
Wei et al.

(10) Patent No.: US 7,231,336 B2
(45) Date of Patent: Jun. 12, 2007

(54) GLITCH AND METASTABILITY CHECKS USING SIGNAL CHARACTERISTICS

(75) Inventors: You-Pang Wei, Los Altos, CA (US); Yuhung Liao, Sunnyvale, CA (US); Mingchi Liu, Santa Clara, CA (US); YuJiao Ping, Santa Clara, CA (US)

(73) Assignee: Legend Design Technology, Inc., Santa Clara, CA (US)

( * ) Notice: Subject to any disclaimer, the term of this patent is extended or adjusted under 35 U.S.C. 154(b) by 429 days.

(21) Appl. No.: 10/729,785

(22) Filed: Dec. 5, 2003

(65) Prior Publication Data

US 2005/0049844 A1    Mar. 3, 2005

Related U.S. Application Data

(60) Provisional application No. 60/497,972, filed on Aug. 25, 2003.

(51) Int. Cl.
*G06F 17/50* (2006.01)
(52) U.S. Cl. .............................. 703/15; 703/14; 703/16; 703/19; 326/57; 326/58; 326/113; 324/765
(58) Field of Classification Search ................ 703/14, 703/15, 16, 19; 326/113; 716/4–5, 10, 12; 714/33; 324/765; 348/180
See application file for complete search history.

(56) References Cited

U.S. PATENT DOCUMENTS

| | | | | |
|---|---|---|---|---|
| 4,656,580 A | * | 4/1987 | Hitchcock et al. | 703/19 |
| 4,787,061 A | * | 11/1988 | Nei et al. | 703/14 |
| 4,787,062 A | * | 11/1988 | Nei et al. | 703/15 |
| 5,091,872 A | * | 2/1992 | Agrawal | 703/14 |
| 5,418,735 A | * | 5/1995 | Saitoh | 703/16 |
| 6,026,226 A | * | 2/2000 | Heile et al. | 716/12 |
| 6,112,022 A | | 8/2000 | Wei | |
| 6,141,631 A | * | 10/2000 | Blinne et al. | 703/14 |
| 6,158,022 A | * | 12/2000 | Avidan | 714/33 |
| 6,249,901 B1 | * | 6/2001 | Yuan et al. | 716/5 |
| 6,285,396 B1 | * | 9/2001 | Har Shoshanim et al. | 348/180 |
| 6,289,412 B1 | | 9/2001 | Yuan et al. | |
| 6,377,065 B1 | * | 4/2002 | Le et al. | 324/765 |
| 6,732,066 B2 | * | 5/2004 | Krishnamoorthy | 703/14 |
| 6,957,406 B1 | * | 10/2005 | Stenz | 716/9 |
| 6,970,017 B2 | * | 11/2005 | Akita et al. | 326/113 |
| 2001/0014851 A1 | * | 8/2001 | Krishnamoorthy | 703/19 |
| 2002/0043990 A1 | * | 4/2002 | Akita et al. | 326/113 |
| 2002/0143516 A1 | * | 10/2002 | Rao et al. | 703/19 |
| 2005/0251775 A1 | * | 11/2005 | Wood | 716/10 |
| 2005/0262454 A1 | * | 11/2005 | Chase et al. | 716/4 |

* cited by examiner

*Primary Examiner*—Kamini Shah
*Assistant Examiner*—Cuong Van Luu
(74) *Attorney, Agent, or Firm*—Buchanan, Ingersoll & Rooney LLP

(57) ABSTRACT

In accordance with the present invention there is provided a method for performing a glitch check in simulating a circuit. Current maximum and minimum values for optimization parameters of the circuit are determined. Next, a signal pulse characteristic for the circuit simulation is determined based on the maximum and minimum optimization parameters. A current averaged optimization parameter is determined from the current maximum and minimum optimization parameters. A prime criterion parameter is calculated based on the optimization parameters and the signal pulse characteristic value. If the prime criterion parameter converges into a specified range then measurement results from the circuit simulation are parsed and reported as final. If the prime criterion parameter does not converge, then the process continues by recalculating the optimization parameters until the prime criterion parameter converges.

16 Claims, 13 Drawing Sheets

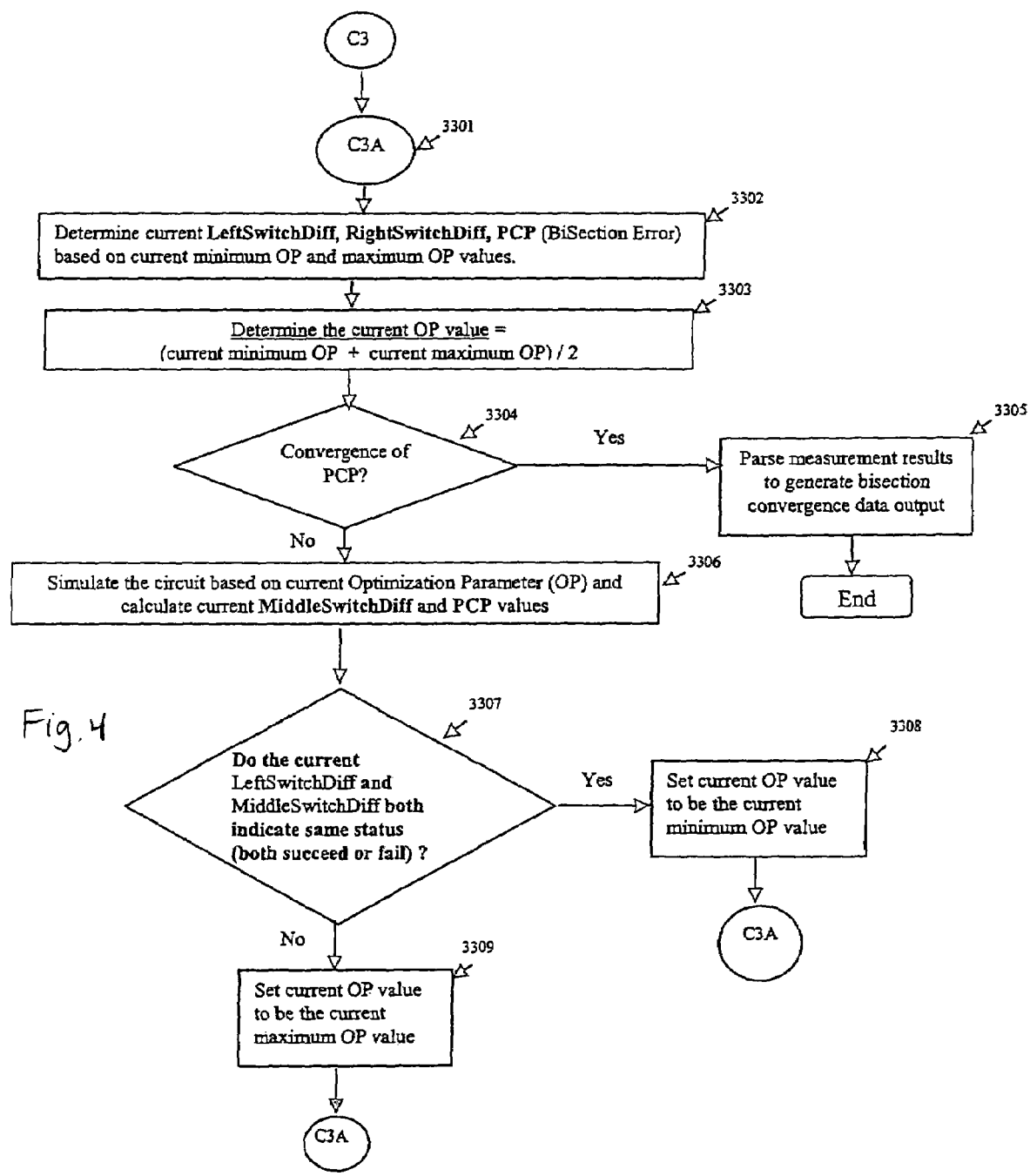

GLITCH AND METASTABILITY CHECKS USING SIGNAL CHARACTERISTICS

RELATED APPLICATIONS

The present application claims the benefit of U.S. Provisional Application No. 60/497,972 entitled "RELIABILITY-BASED CHARACTERIZATION SYSTEM IN IC/SoC DESIGNS" filed Aug. 25, 2003, the entire contents of which are incorporated herein by reference.

FIELD OF INVENTION

The present invention generally relates to computer aided methods and tools for designing, simulating, characterizing and verifying integrated circuit (IC) designs, and more particularly to a system and method for verifying and characterizing the noise margin of signals within such designs.

BACKGROUND OF THE INVENTION

The design of very large-scale integrated (VLSI) circuits using computer aided design (CAD) systems is a very time consuming and computationally intensive process. As the complexity of VLSI circuit design has increased, circuit designers have begun incorporating basic circuit building blocks into circuit designs so that the designers do not need to start from scratch for each design. This design approach is commonly referred to as an intellectual property (IP) based design approach and the basic circuit building blocks are referred to as IP blocks.

In accordance with system on chip (SOC) technology, a variety of circuit building blocks are incorporated onto a single integrated chip. Each of the building blocks performs a specific function of an electronic system. The IP building blocks include, but are not limited to, embedded memory, standard cell, I/O devices, analog and system interfaces, etc.

A timing model including many characterized timing parameters for each IP block that is to be incorporated into a system chip is required by the IC designers. Important timing parameters include setup time, hold time, access time, minimum pulse high and low time, and other I/O pin characteristics. Designers are interested in characterizing and optimizing timing characteristics associated with an IP block design.

There are two methods of IP block characterization and verification. The first method is based on 'full circuit' simulations. For deep submicron designs, a netlist size of layout-extracted IP blocks could be enormous with a large number of resistors and capacitors. It might be prohibitive to run numerous full circuit simulations with a high-accuracy circuit simulator. The other method is a characterization based on 'critical-path circuit' simulations. Instead of using a full circuit, a small detailed critical circuit including multiple critical paths is used of simulation. The 'critical-path circuits' are built either manually or by software tools for automation, accuracy and performance.

The simulation results observed during the characterization process are only at the pins of the full circuit or at ports of the 'critical-path circuit'. Reliability issues such as noise margin, glitch, and racing conditions that occur inside the circuit are normally ignored. Accordingly, the timing parameters generated by the simulation may be too optimistic and incorrect.

Furthermore, the circuit or subcircuit block is viewed as a black-box when the circuit simulation is performed. However, the simulations results observed at the pins cannot detect the above-mentioned reliability issues that can occur inside the circuit. The models based upon simulation and characterization results could be incorrect thereby causing yield and reliability problems.

SUMMARY OF THE INVENTION

In accordance with the present invention, there is provided a method of performing a glitch check in simulating a circuit. Current maximum and minimum values for optimization parameters of the circuit are determined. The optimization parameters are setup or hold time for the circuit simulations. Next, a signal characteristic for the circuit simulation is determined based on the maximum and minimum optimization parameters. The signal characteristic can be either the height or width of the signal pulse, or the slew time of the signal transition. A current averaged optimization parameter is determined from the current maximum and minimum optimization parameters. A prime criterion parameter is calculated based on the optimization parameters and the signal characteristic value. If the prime criterion parameter converges into a prescribed range, then measurement results from the circuit simulation are parsed.

However, if the prime criterion parameter does not converge into the prescribed range, then the circuit is simulated based on the current optimization parameter and a new signal characteristic is calculated. Next, the results of the circuit simulation based on the signal characteristic value are determined. The current optimization parameter is set to a new optimization parameter in response to the signal pulse characteristic value. Specifically, the current optimization parameter is set a new optimization parameter that is the maximum value of the optimization parameter if the current optimization parameter and the minimum optimization parameter do not indicate the same status (i.e., one succeeds and the other fails). If the current optimization parameter and the minimum optimization parameter indicate the same status (i.e., both succeed or both fail), then the current optimization parameter is set to be the current minimum optimization parameter. Once the optimization parameter has been set, the process will reiterate until the prime criterion parameter converges into the prescribed range.

In accordance with the present invention, there is provided a method of performing a glitch check on multiple nodes of a simulated circuit. The method comprises determining a current optimization parameter from a maximum optimization parameter and the minimum optimization parameter of the circuit simulation. A prime criterion parameter is calculated based on the optimization parameters. If the prime criterion parameter does converge, then the current optimization parameter is saved as a set up or hold time for the circuit simulation. If the prime criterion parameter does not converge, then the circuit is simulated based on the current optimization parameter and a current prime criterion parameter is calculated based on the circuit simulation. Next, a secondary criterion parameter is checked for all reference nodes. If any secondary criterion parameter among all the reference nodes falls beyond a prescribed limit, then the status of the simulation based on the current optimization parameter is set to fail. Otherwise, the status of the simulation is set to succeed.

The prime criterion parameter is a bisection error of the circuit simulation. The process will reiterate until the prime criterion parameter converges into a prescribed range. The secondary criterion parameter may be the height of a signal pulse or a metastable time of the signal pulse. The current optimization parameter is set to be the current minimum optimization parameter value when the current optimization parameter and the minimum optimization parameter both indicate the same status (i.e., both indicate succeed or fail). On the other hand, the current optimization parameter is set to be the current maximum optimization parameter value when the current optimization parameter and the minimum optimization parameter do not indicate the same status (i.e., one indicates succeed while the other indicates fail).

BRIEF DESCRIPTION OF THE DRAWINGS

These, as well as other features of the present invention, will become more apparent upon reference to the drawings wherein:

FIG. 4 is a flowchart illustrating a metastability check;

DETAILED DESCRIPTION

Various aspects will now be described in connection with exemplary embodiments, including certain aspects described in terms of sequences of actions that can be performed by elements of a computer system. For example, it will be recognized that in each of the embodiments, the various actions can be performed by specialized circuits or circuitry (e.g., discrete and/or integrated logic gates interconnected to perform a specialized function), by program instructions being executed by one or more processors, or by a combination of both. Thus, the various aspects can be embodied in many different forms, and all such forms are contemplated to be within the scope of what is described. The instructions of a computer program as illustrated in FIG. 1 for performing a reliability-based characterization can be embodied in any computer readable medium for use by or in connection with an instruction execution system, apparatus, or device, such as a computer based system, processor containing system, or other system that can fetch the instructions from the instruction execution system, apparatus, or device and execute the instructions.

As used here, a "computer-readable medium" can be any means that can contain, store, communicate, propagate, or transport the program for use by or in connection with the instruction execution system, apparatus, or device. The computer-readable medium can be, for example but not limited to, semiconductor system, apparatus, device, or storage medium that electronic, magnetic, optical, electromagnetic or infrared signals can be stored into or read from. More specific examples (a non exhaustive list) of the computer readable-medium can include the following: an electrical connection having one or more wires, a portable computer diskette, a random access memory (RAM), a read only memory (ROM), an erasable programmable read only memory (EPROM or Flash memory), an optical fiber, and a portable compact disc read only memory (CD ROM).

"TIMING SOFT ERROR CHECK", application Ser. No. 10/729,596; "RELIABILITY BASED CHARACTERIZATION USING BISECTION", application Ser. No. 10/729,697; and "VERIFICATION AND CHARACTERIZATION OF NOISE MARGIN IN INTEGRATED CIRCUIT DESIGNS" application Ser. No. 10/729701, filed concurrently herewith and the entire contents of each application are incorporated herein by reference.

Figure 1A:
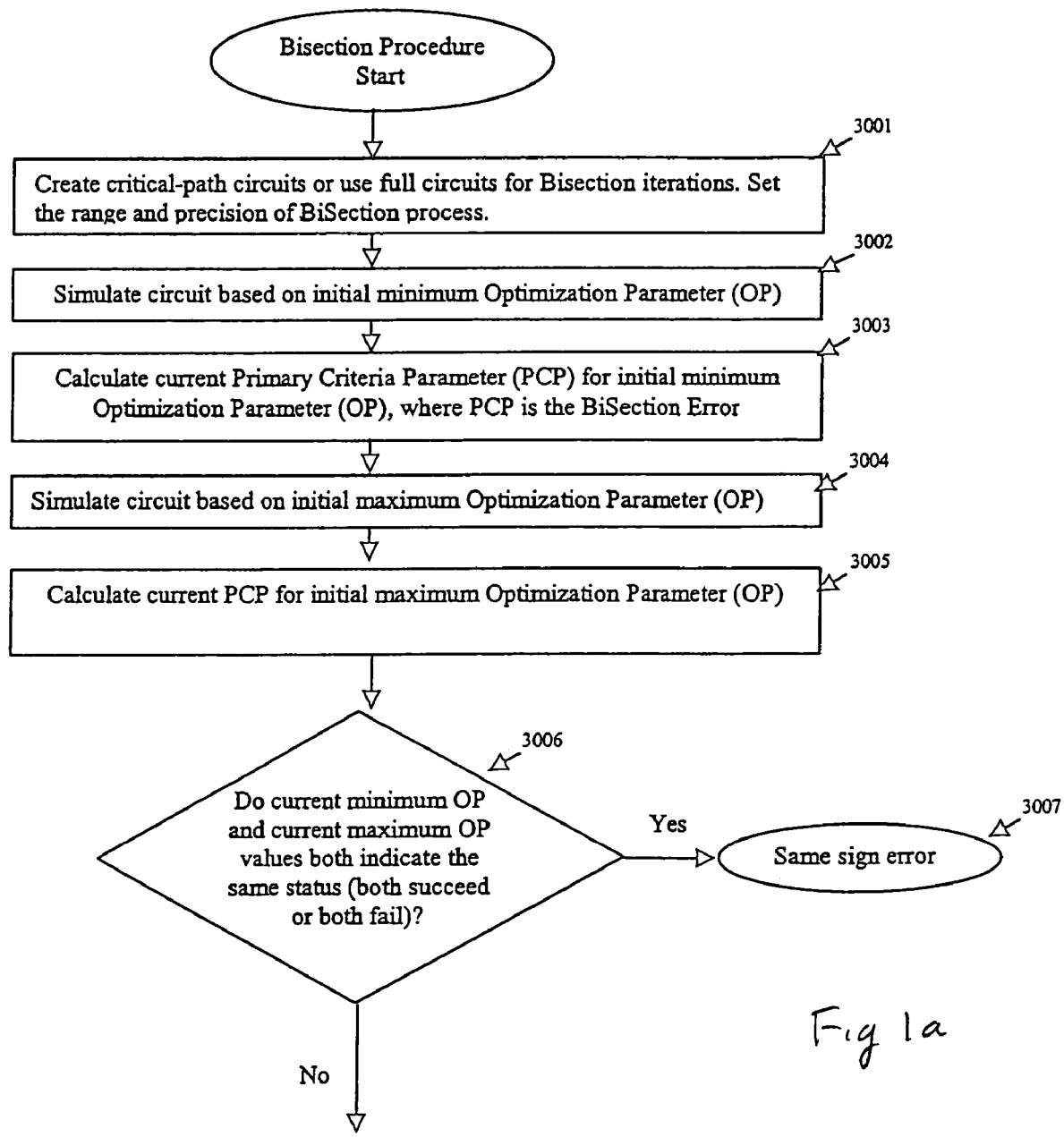
FIGS. 1a and 1b are flowcharts illustrating a reliability-based characterization test using bisection.
Figure 1B:
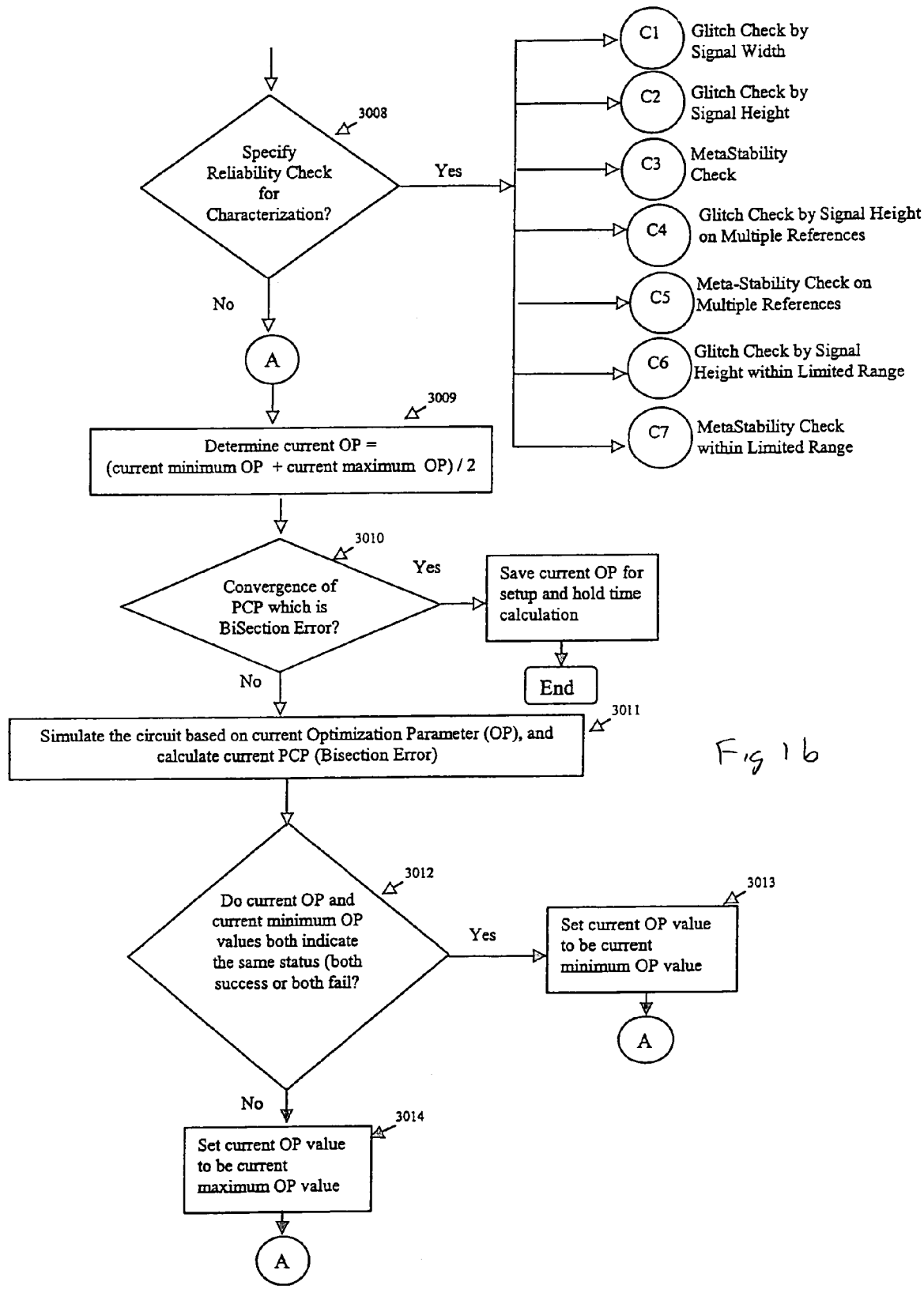

Referring now to the drawings wherein the showings are for purposes of illustrating preferred embodiments of the present invention only, and not for purposes of limiting the same, is FIGS. 1a and 1b are flowcharts illustrating a method of determining an optimized parameter for a circuit simulation, in step 3001, critical-path circuits of full circuits for the circuit simulations are determined for the bisection procedure. The range and precision of the bisection procedure and clock cycle timing need to be decided. In step 3002, the circuit is simulated based upon an initial optimization parameter (OP). For the reliability-based characterization illustrated in FIGS. 1a and 1b, the OP is the setup time or hold time for the circuit. The initial minimum and maximum OP's are determined by user specified information. In step 3003, the primary criteria parameter (PCP) is calculated for the initial minimum OP. The PCP is the bisection error for the setup time or hold time. Once the PCP is calculated, then the circuit is simulated in step 3004 for the initial maximum optimization parameter (OP). In step 3005, the current PCP is then calculated for the initial maximum OP.

In step 3006, the current minimum OP and the current maximum OP are compared to determine if they both fail or succeed. Specifically, if both the current maximum OP and the current minimum OP both indicate the same status (both succeed or both fail), then the process proceeds to step 3007 where the process ends because of a same sign error. However, if both the current minimum OP and the current maximum OP do not indicate the same status, then the process proceeds to step 3008 where other reliability checks on the circuit may be performed. Specifically, the user has the option of performing glitch and metastability checks C1-C7.

Figure 2:
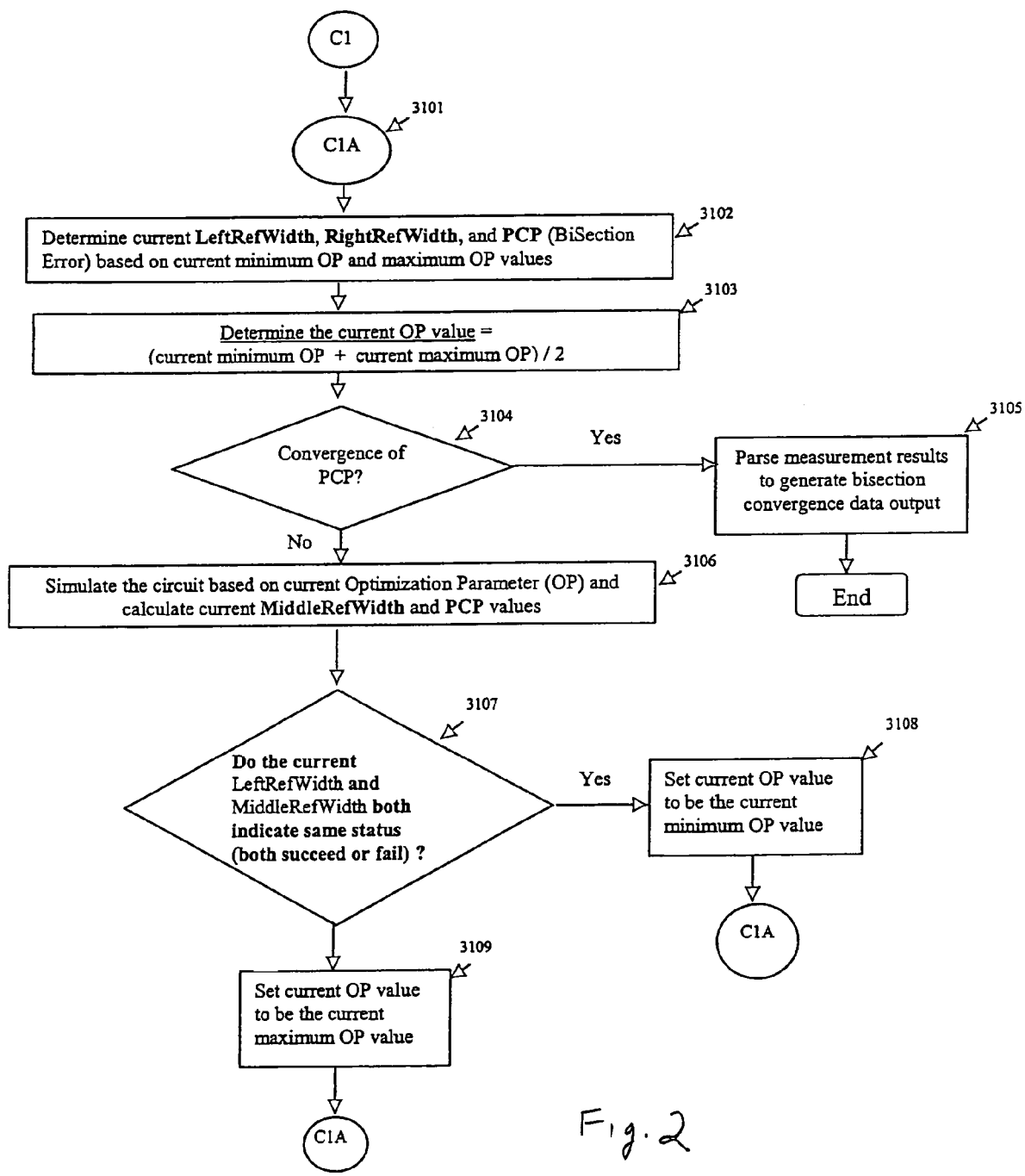
FIG. 2 is a flowchart illustrating a glitch check using signal width.

Referring to FIG. 2, the process for performing a glitch check by signal width from process C1 of FIG. 1b is shown. The process begins in step 3102 by determining the current left reference width (LeftRefWidth) and the current right reference width (RightRefWidth) for the signal pulse of the reference node during bisection iteration. Furthermore, the prime criterion parameter (PCP) is determined. For this test, the POP is the bisection error. The LeftRefWidth, RightRefWidth and PCP is based on the current minimum and maximum values of the optimization parameter which for this test is either the setup time or hold time.

In step 3103, the current OP value is determined. Specifically, the current OP value is equal to the average of the current minimum OP value and the current maximum OP value. In step 3104, it is determined whether the PCP (i.e., bisection error) converges. The convergence is determined by whether the bisection error has converged into a bisection precision range which is specified by users. If the convergence has been achieved, then the process proceeds to step 3105 wherein the measurement results are parsed to generate bisection convergence data output and the process ends.

However, if the PCP does not converge in step 3104, then the process proceeds to step 3106 where the circuit is simulated based on the current value of the optimization parameter (OP) so that the current middle reference width of the signal pulse can be calculated, as well as the current value of the PCP (i.e., bisection error). In step 3107, the LeftRefWidth and the MiddleRefWidth are compared. If they both indicate the same status as either succeeding or failing, then the process proceeds to step 3108 wherein the current OP value is set to the current minimum OP value. The process then proceeds to step 3101 wherein the process proceeds until convergence of the PCP.

However, if the LeftRefWidth and the MiddleRefWidth do not indicate the same status, then the process proceeds to step 3109 wherein the current OP value is set to be the maximum OP value. Once the OP value has been set in step 3109, the process returns to step 3101 where to repeat the procedure until the PCP converges in step 3104.

Figure 3:
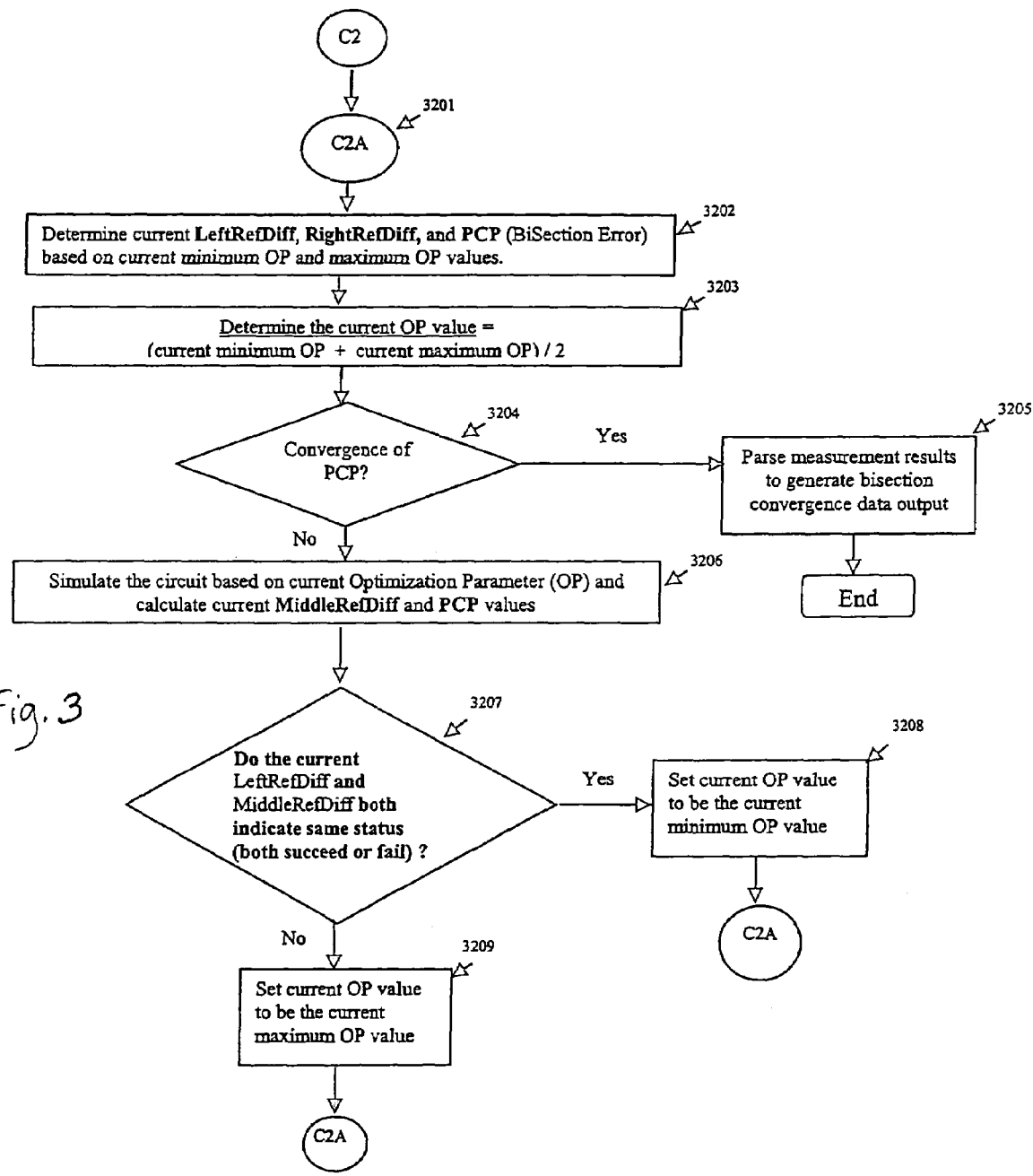
FIG. 3 is a flowchart illustrating a glitch check using signal height.

Referring to FIG. 1b. another check that can be specified in step 3008 is the glitch check by signal height (C2). As seen in FIG. 3, the process for determining whether there is a glitch by checking the height of the reference signal is shown. The process is similar to that shown in FIG. 2, however, the height of the reference signal is used instead of the width. Accordingly, in step 3202 the current LeftRefDiff, RightRefDiff and PCP (i.e., bisection error) are determined for the current minimum and maximum OP's. For this test, the OP is the setup time or hold time. The LeftRefDiff, RightRefDiff and MiddleRefDiff are the height of the signal pulse during bisection iteration. In step 3203, the current OP value is calculated as the average of the minimum OP value and the maximum OP value. In step 3204, it is determined whether the PCP converges to a bisection precision range which is specified by the user. If the PCP has converged, then the process proceeds to step 3205 whore the measurement results are parsed to generate bisection convergence data output and the process ends.

However, if the PCP does not converge in step 3204, then the process proceeds to step 3206 where the circuit is simulated based on the current OP found in step 3203. When the circuit is simulated, then the current MiddleRefDiff and PCP values are calculated. In step 3207, the current LeftRefDiff and MiddleRefDiff are analyzed to see if they have the same status. In this respect, the status of both the LeftRefDiff and MiddleRefDiff are checked to see if they are the same (i.e., both fail or succeed). If the status is the same, then the process proceeds to step 3208 wherein the current OP value is set to be the current minimum OP value. The process then returns to step 3201 wherein the procedure is performed again until convergence of the PCP in step 3204.

If the current LeftRefDiff and MiddleRefDiff do not indicate the same status in step 3207, then the process proceeds to step 3209 wherein the current OP value is set to be the maximum OP value. The process returns to step 3201 wherein the procedure is performed again until convergence of the PCP in step 3204.

In addition to the foregoing, it is also possible for a metastability check to be performed for characterization. The metastability check assures that there is no metastability or that the metastability is under the specified tolerance. For example, in step 3008 of FIG. 1b, a metastability check (C3) may be chosen. Referring to FIG. 4, the metastability check is performed by determining the current slew time of signal transition during bisection iteration. Specifically, in step 3302, the current LeftSwitchDiff and RightSwitchDiff are determined based on current minimum OP and maximum OP values. The LeftSwitchDiff and RightSwitchDiff are the slew time of the signal transition. The OP is the optimization parameter of setup time or hold time, Furthermore, the current PCP (i.e., bisection error) is determined in step 3302 for the current maximum and minimum OP values.

In step 3303, the current OP value is set to be the average of the current minimum and maximum OP values. In step 3304, it is determined whether the bisection error (i.e., PCP) converges into a user defined bisection error precision range. If the PCP has converged into the range, then the process proceeds to step 3305 wherein the measurement results are parsed to generate bisection convergence data output. However, if the PCP does not converge in step 3304, then the process proceeds to step 3306 wherein the circuit is simulated based on the current optimization parameter determined in step 3303. The current MiddleSwitchDiff and the current PCP values are also calculated in step 3306.

In step 3307, the current LeftSwitchDiff and MiddleSwitchDiff are compared to see if they indicate the same status (i.e., both succeed or both fail). If the LeftSwitchDiff and MiddleSwitchDiff do indicate the same status, then in step 3308 the current OP value is set to be the current minimum OP value and the process returns to step 3301 for further processing. However, if the LeftSwitchDiff and the MiddleSwitchDiff do not indicate the same values, then the current OP value is set to the maximum OP value and the process returns to step 3301.

Figure 5A:
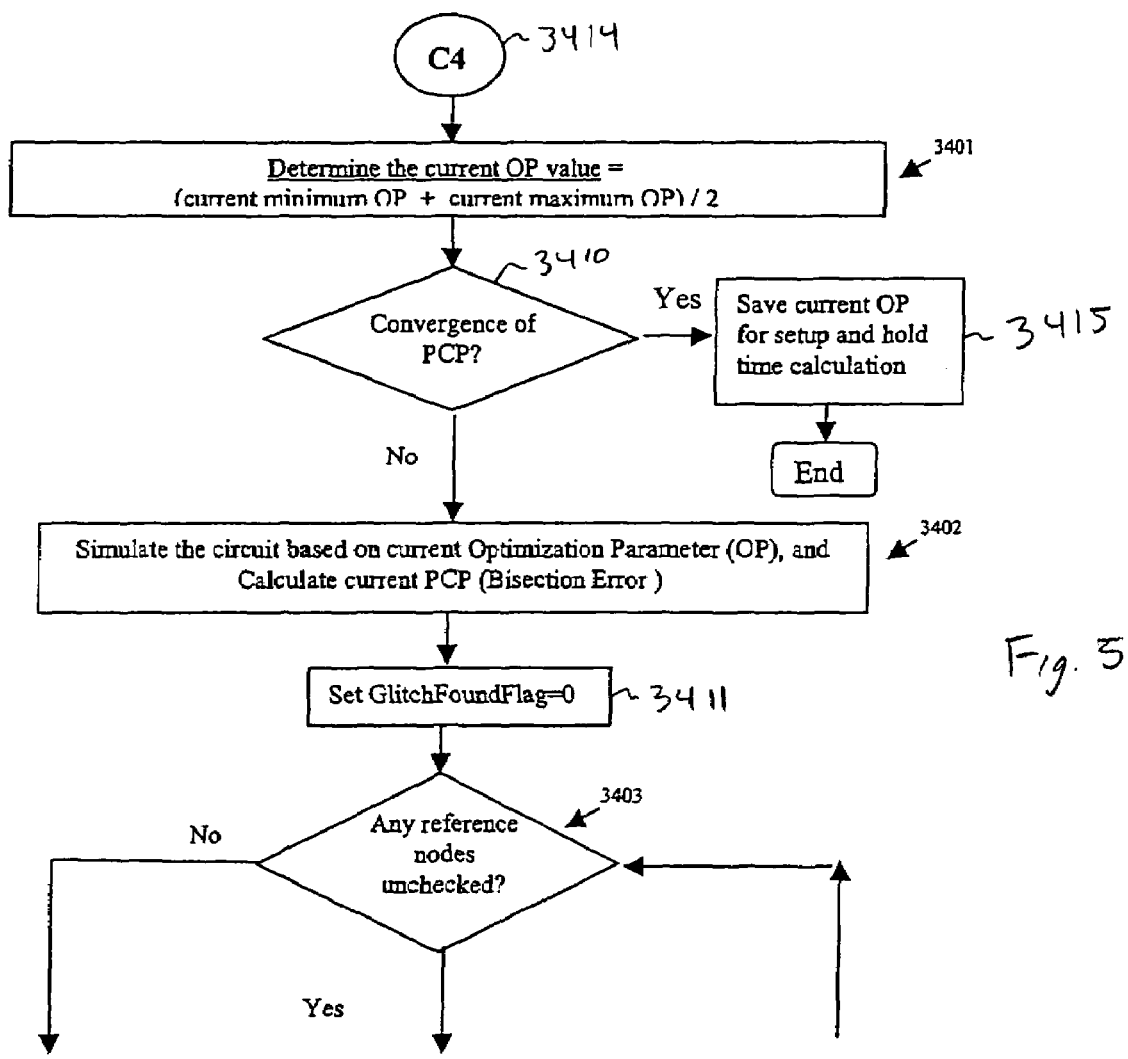
FIGS. 5a and 5b are flowcharts illustrating a glitch check by signal height on multiple reference nodes.
Figure 5B:
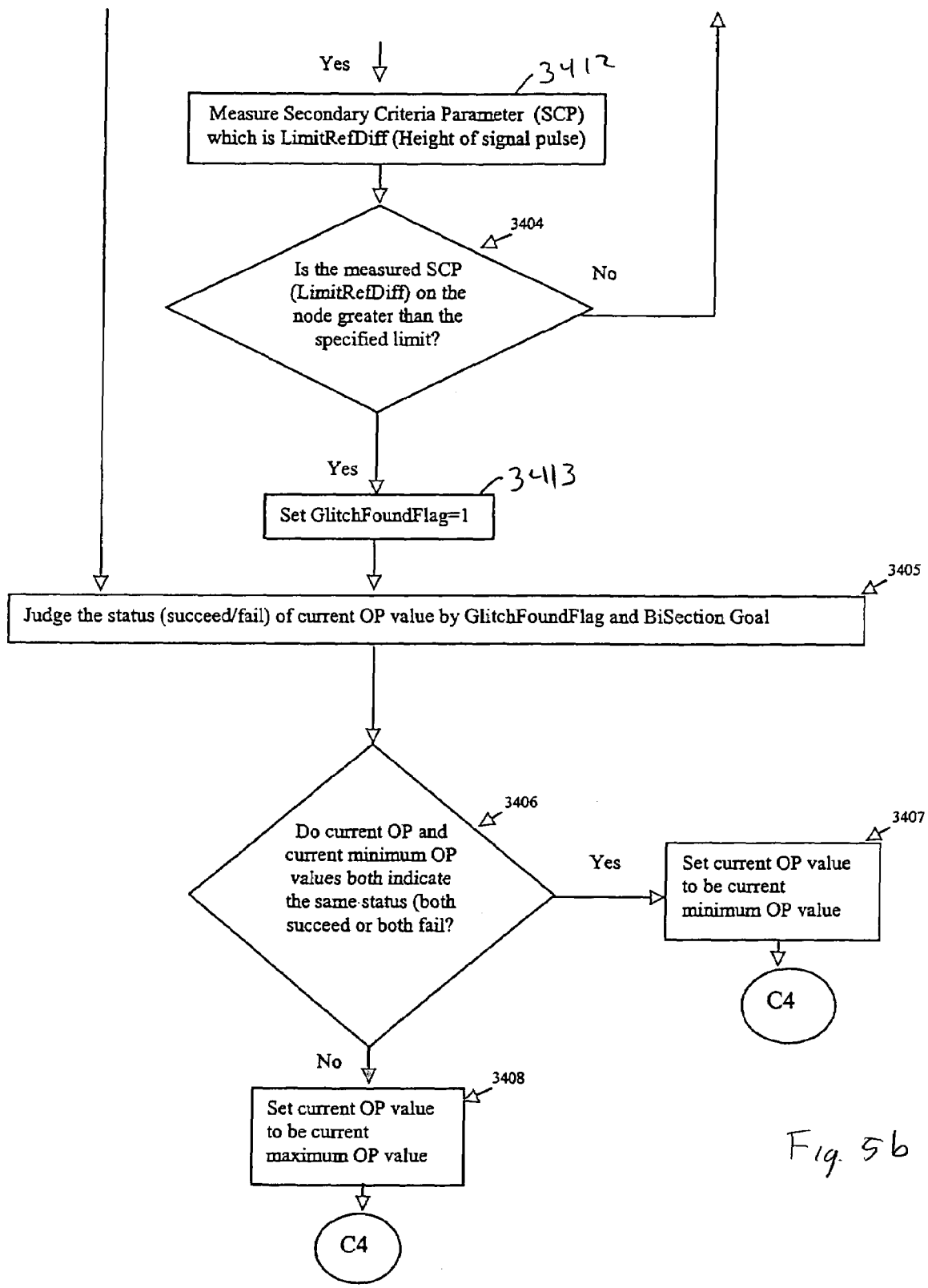

It Is also possible to use the setup and/or hold time characterization to assure that there is either no glitch or a glitch is under a specified tolerance on multiple reference nodes. Specifically, in step 3008 of FIG. 1b, a glitch check by signal height on multiple references (C4) can be chosen to be performed. Referring to FIGS. 5a and 5b, the current OP is determined by averaging the current minimum and maximum OP's in step 3401. The optimization parameter (OP) is the setup time or the hold time. Next, in step 3410, the PCP (i.e., bisection error) is checked to see if it converges into a user defined bisection error range. If the PCP does converge, then the current OP is saved for setup and hold time calculations in step 3415. However, if the PCP does not converge in step 3410, then the circuit is simulated in step 3402 based on the current optimization parameter determined in step 3401. Furthermore, the current PCP is calculated in step 3402.

In steps 3403-3405, all reference nodes are checked to see if there is any node whose measured secondary criterion parameter (SCP), hereby the height of the signal pulse, exceeds a prescribed value. If any such node is found, then the status of the current iteration is considered 'fail'. If no such node is found and the bisection goal is met, then the status of the current iteration is considered to be 'succeed'.

In step 3406, the status of the current OP and the current minimum OP are compared. If they both indicate the same status (i.e., both succeed or both fail) then the current OP value is set to the current minimum OP value in step 3407. After the value has been set, then the process returns to step 3414 for iteration. However, if the current OP and the current minimum OP do not indicate the same status, then the current OP value is set to the maximum OP value in step 3408 and the process returns to step 3414 for further iterations. In this regard, it is possible to perform a glitch check on multiple reference nodes.

Figure 6A:
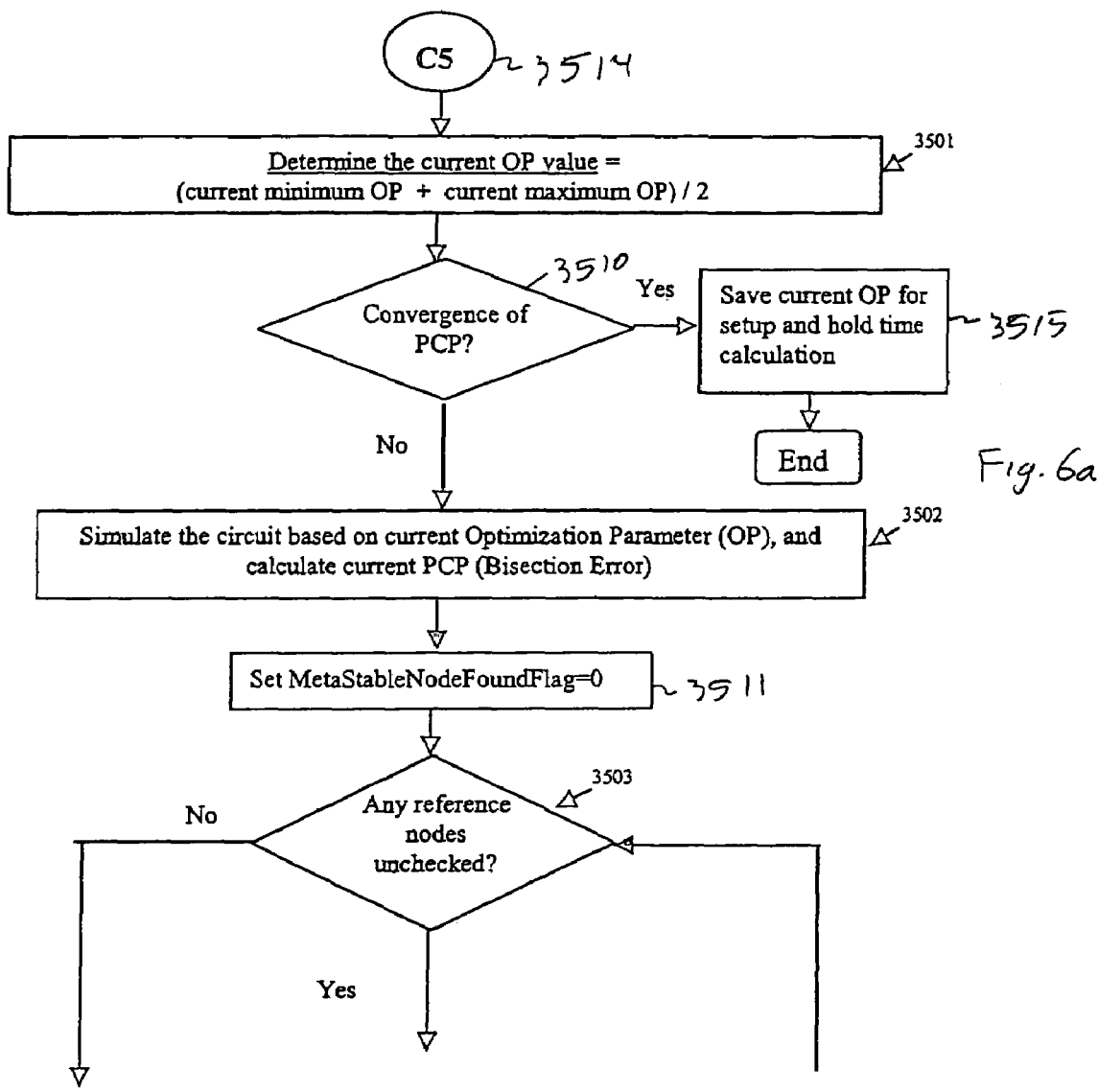
FIGS. 6a and 6b are flowcharts illustrating a metastability check on multiple reference nodes.
Figure 6B:
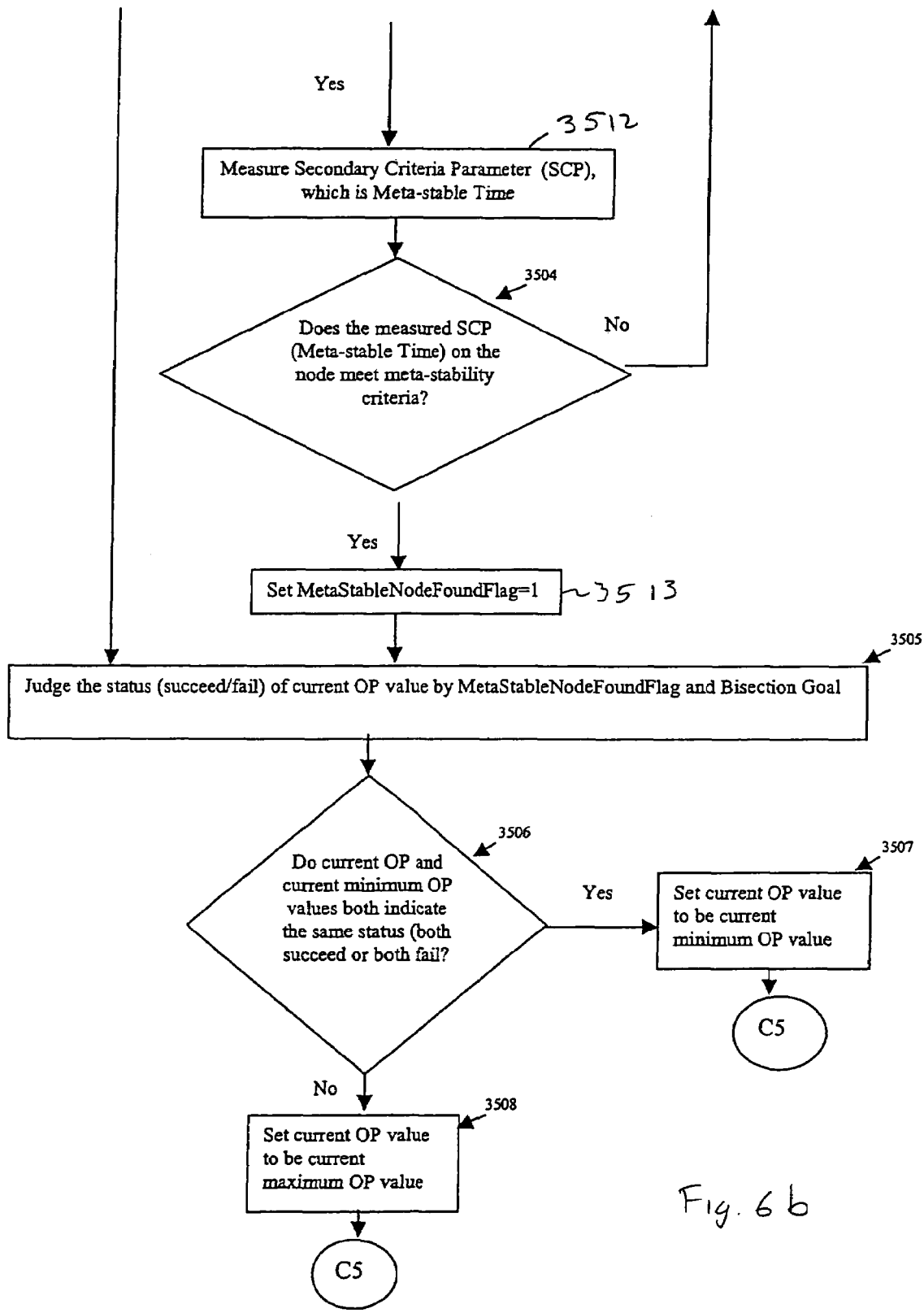

Similarly, the user has the option to perform metastability checks on multiple reference nodes in step 3008 of FIG. 1b. Referring to FIGS. 6a and 6b, the metastability check on multiple reference nodes is similar to the glitch check for multiple reference nodes described for FIGS. 5a and 5b with the only difference being the secondary criterion parameter is the meta-stable time that is the time that the signal stays in a narrow voltage range (e.g., 0.3*VDD to 0.7*VDD) during the transition.

For example, referring to FIGS. 6a and 6b, in step 3501 the current OP value is determined to be the average of the current minimum and maximum OP values. The OP value is the setup time or the hold time. In step 3510, it is determined whether the PCP (e.g., bisection error) converges into the user-defined bisection error range. If the PCP does converge into the range, then the current OP is saved as the setup or hold time and the process ends. However, if the PCP does not converge, then the circuit is simulated in step 3502 based on the current OP and the current PCP is calculated.

In steps 3503-3505, all reference nodes are checked to see if there is any node with a measured secondary criterion parameter (SCP), hereby the metastable time of the signal transition is the time that the signal stays in a narrow voltage range during the transition, that exceeds a prescribed limit typically within the voltage range of 0.3*Vdd and 0.7*Vdd. If there is any such node found, the status of the current iteration is considered to be 'fail'. If no such node is found and the bisection goal is met, the status of the current iteration is considered to be 'succeed'. In step 3506, the current Op and the current minimum OP values are compared to see whether they both indicate the same status. If they both indicate the same status (i.e., both succeed or both fail) then the current OP value is set to the minimum OP value in step 3507 and the process returns to step 3514 for further iterations. If the current OP and the current minimum OP do not both indicate the same status, then the process proceeds to step 3508 where the current OP value is set to be the maximum OP value. When the current OP value has been set, then the process returns to step 3514 for further iterations.

Figure 7A:
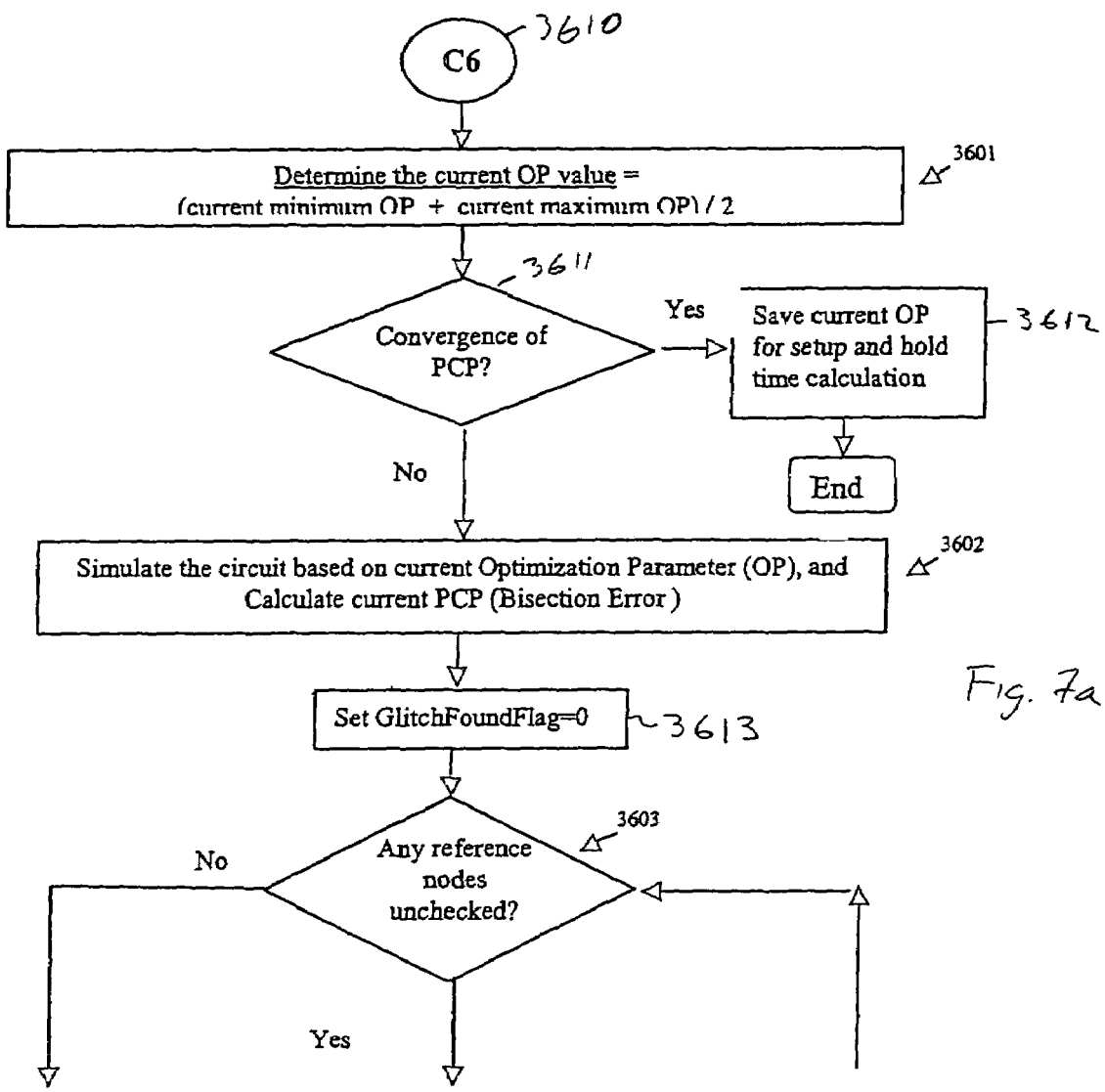
FIGS. 7a and 7b are flowcharts illustrating a glitch chock by signal height within limited range.
Figure 7B:
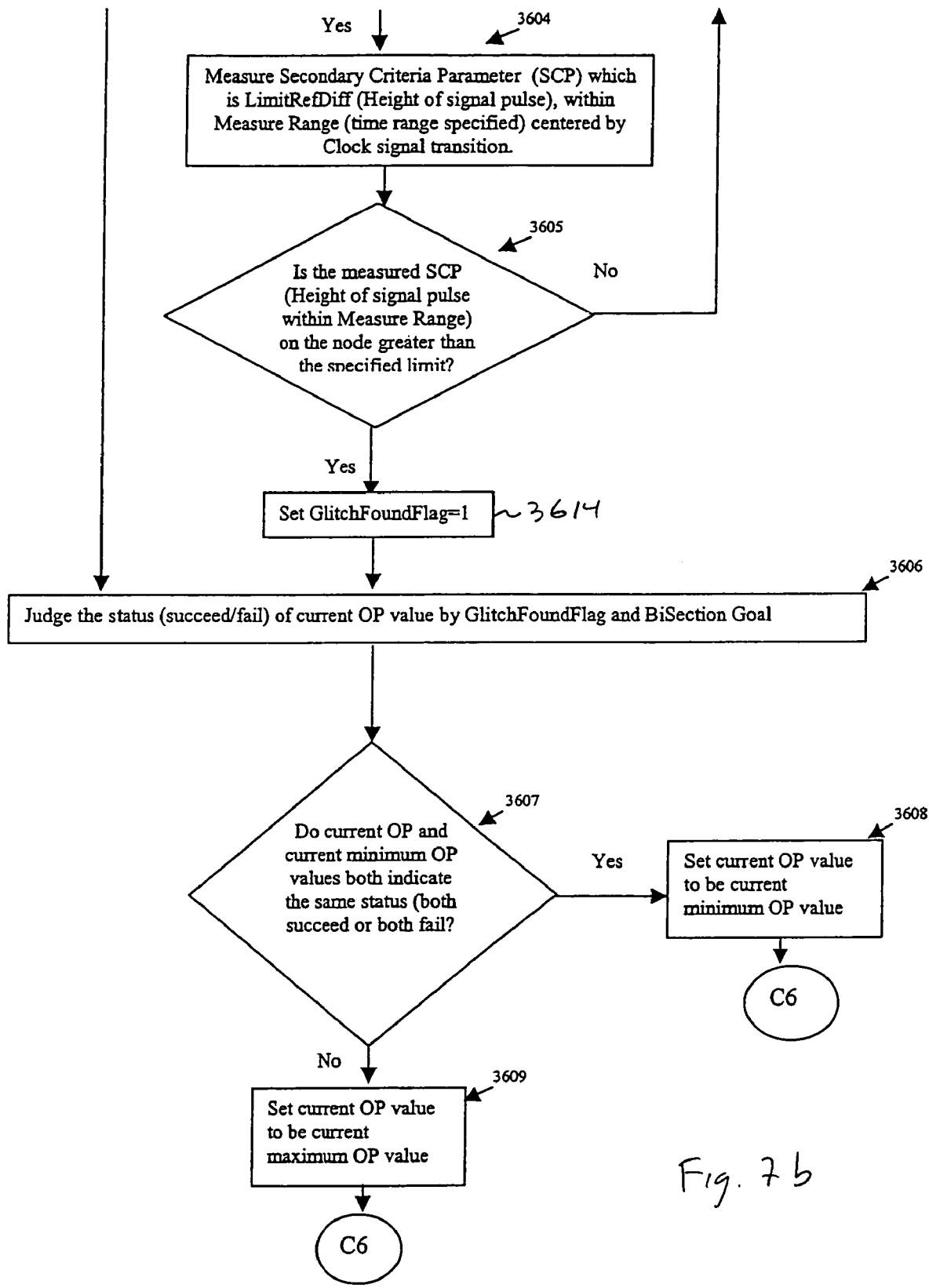

Similarly, it is possible to perform a glitch check by signal height with limited range from step 3008 of FIG. 1b. Referring to FIGS. 7a and 7b, the setup and hold time characterization with glitch check by signal height will assure that within a limited range centered by the clock signal transilion that there are no glitches or that the glitch is under a specified tolerance. In step 3601, the current optimization parameter (OP) is determined by averaging the current minimum OP and the current maximum OP. The OP is the setup time or hold time. In step 3611, it is determined whether the PCP (primary Criterion parameter) that is the bisection error converges into a defined bisection error range. If the PCP does converge, then in slop 3612 the current OP is saved for the setup and hold time calculation.

In steps 3603-3606, all reference nodes are checked to see if there is any node with a measured secondary criterion parameter (SCP), hereby the height of a signal pulse within a specified measurement range, that exceeds a prescribed value. If any such node is found, then the status of the current iteration is considered 'fail'. If no such node is found and the bisection goal is met, then the status of the current iteration is considered to be 'succeed'.

In step 3607, the status of the current OP and the current minimum OP are compared to see if they are the same (i.e., both succeed or both fail). If the status is the same, then the process proceeds to step 3608 where the current OP value is set to be the minimum OP value and the process returns to step 3610. If the status of the current OP and the current minimum OP are not the same, then the current OP value will be set the current maximum value and the process returns to step 3610 for further iterations.

Figure 8A:
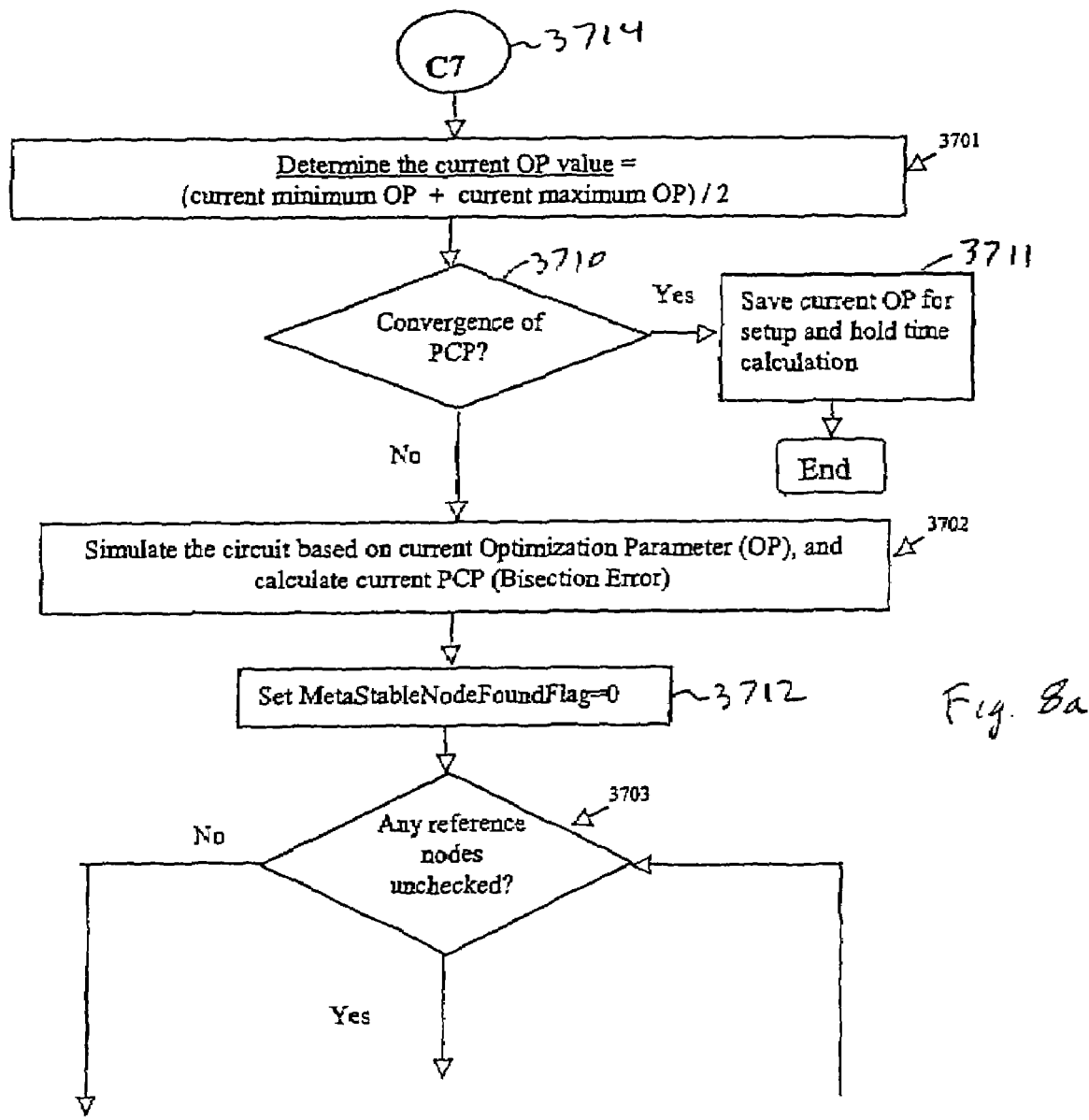
FIGS. 8a and 8b are flowcharts illustrating a metastability check within a limited range.
Figure 8B:
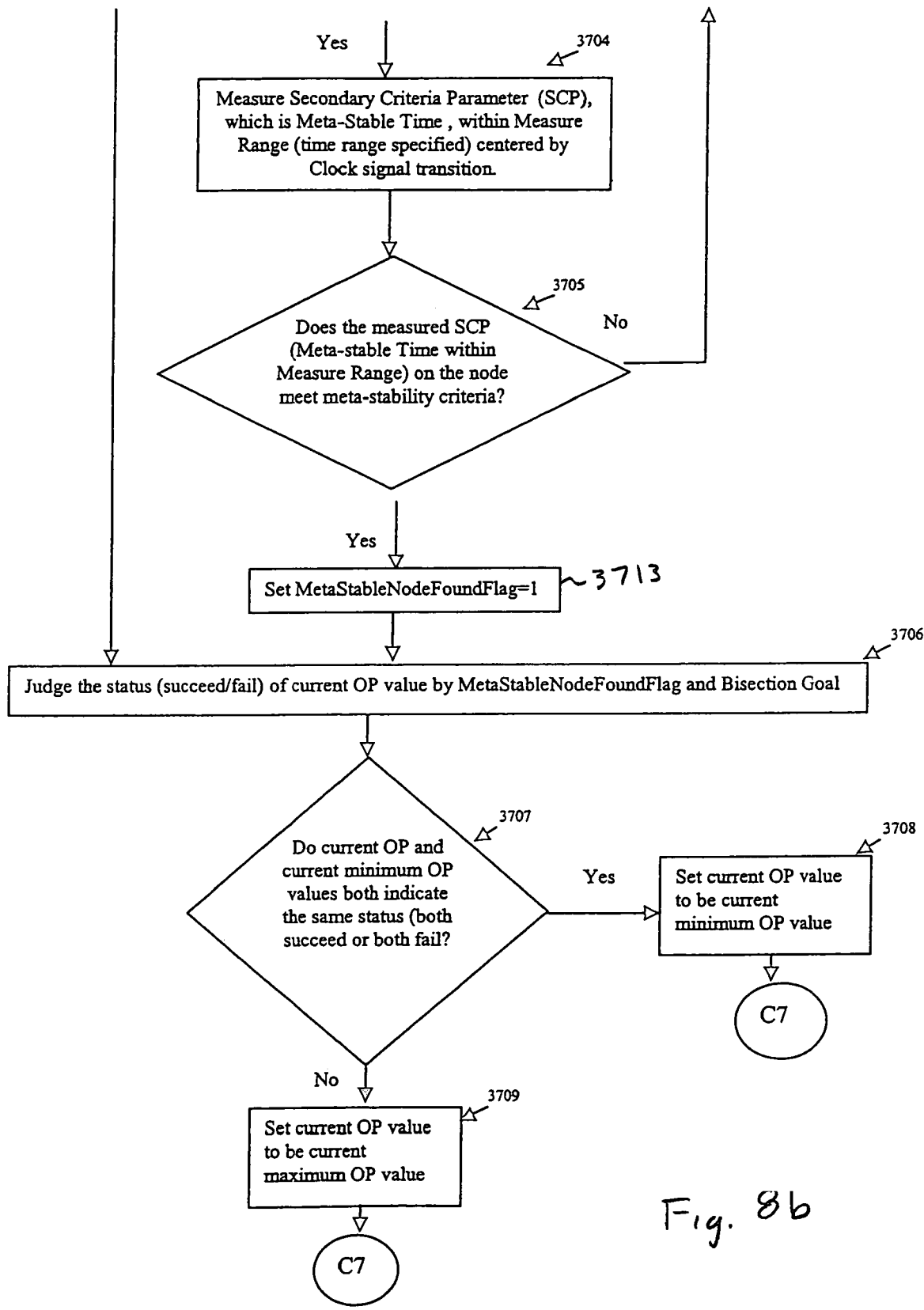

It is also possible to perform a characterization with a meta-stability check with limited range from step 3008 of FIG. 1b. Referring to FIGS. 8a and 8b, the check will assure that there is no metastability or metastability under a specified tolerance for a limited range centered by the clock signal transition. In step 3701 of FIG. 8a, the current OP (e.g., setup time or hold time) is determined by averaging the current minimum OP and the current maximum OP. Next, in step 3710 the PCP (e.g., bisection error) is checked for convergence into a specified bisection error range. If the PCP converges, then the current OP is saved for the setup and hold time calculations in step 3711. If the PCP does not converge, then the circuit is simulated based on the current OP in step 3702, The current PCP will also be calculated in step 3702.

In steps 3703-3706, all reference nodes are checked to see if there is any node whose measured secondary criterion parameter (SCP), hereby the meta-stable time of the signal transition within a specified measurement range, exceeds a prescribed value. If any such node is found, then the status of the current iteration is considered to be 'fail'. If no such node is found and the bisection goal is met, then the status of the current iteration is considered to be 'succeed'.

In step 3707, it is determined whether the status of both the current OP and the current minimum OP are the same. If the status is the same (i.e., they are both succeed or both fail), then in step 3708 the current OP value is set to be the current minimum OP value and the process returns to step 3714 for further iterations. However, if the status is not the same for both the current OP and the current minimum OP in step 3707, then the current Op value will be set to the current maximum OP value in step 3709 and the process will return to step 3714 for further iterations until the PCP converges.

Referring back to FIG. 1b, if the user decides not to perform other reliability checks in step 3008, then the process proceeds to step 3009 where the current OP is calculated. Specifically, the current OP is calculated by averaging the current minimum OP and the current maximum OP. After the current OP has been calculated, then the PCP is checked for convergence in step 3010. Specifically, the convergence is determined by whether the bisection error (i.e., PCP) has converged into a bisection precision range which is specified by the user. If the bisection error has converged, then the current OP is saved as the setup and hold time for any subsequent calculations. However, if there is not convergence of the bisection error, then the circuit is simulated again in step 3011 using the current OP calculated in step 3009.

Once the circuit simulation has been performed, the process proceeds to step 3012 wherein the current OP and the current minimum OP are compared. If both values indicate the same status (i.e., both success or both fail), then the process proceeds to step 3013 wherein the current OP value is set to be the current minimum OP value. Furthermore, the process proceeds to point "A" where in step 3009, the current OP is calculated until convergence occurs.

However, if in step 3012, the current OP and the current minimum OP values do not indicate the same status, then the process proceeds to step 3014 wherein the current OP is set to be the maximum OP value. Then the process returns to point "A" and step 3009 where the process continues until the bisection error converges. In this respect, the process iteratively repeats to find the optimized setup and hold time.

It will be appreciated by those of ordinary skill in the art that the concepts and techniques described here can be embodied in various specific forms without departing from the essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A method of performing a glitch check in simulating a circuit, the method comprising the following steps:
   determining current maximum and minimum values for an optimization parameter of the circuit;
   determining a signal characteristic value for circuit simulation based on the current maximum and minimum optimization parameters, said signal characteristic value being the width of a signal pulse;
   determining a current average optimization parameter;
   calculating a prime criterion parameter based on the current minimum and maximum optimization parameters and the signal characteristic value;
   determining whether the prime criterion parameter converges to a prescribed range;
      if the prime criterion parameter converges into the prescribed range then parsing measurement results from the circuit simulation, saving the current average optimization parameter, and ending the process;
      if the prime criterion parameter does not converge into the prescribed range;
   simulating the circuit based on the current average optimization parameter;
   calculating a new signal characteristic value using the circuit simulation;
   determining the results of the circuit simulation based on the new signal characteristic value;
   setting the current average optimization parameter to a new optimization parameter in response to the new signal characteristic value; and
   repeating the process of determining whether the prime criterion parameter converges into the prescribed range,
   wherein the width of the signal pulse is measured respectively for simulations based on the current minimum, current maximum and current average optimization parameters and wherein the current average optimization parameter is set to be the current minimum optimization parameter if both simulations based on the current minimum and current average optimization parameters indicate the same status, either both succeed or both fail, otherwise the current average optimization parameter is set to be the current maximum optimization parameter.

2. The method of claim 1 wherein the succeed status is determined if the simulation result meets a user-prescribed condition and the width of the signal pulse is no less than said user-prescribed condition, and the fail status is determined if the simulation result doesn't meet said user-prescribed condition or the width of the signal pulse is less than said user prescribed condition.

3. A method of performing a glitch check in simulating a circuit, the method comprising the following steps:
   determining current maximum and minimum values for an optimization parameter of the circuit;
   determining a signal characteristic value for circuit simulation based on the current maximum and minimum optimization parameters, said signal characteristic value being the height of a signal pulse;
   determining a current average optimization parameter;
   calculating a prime criterion parameter based on the current minimum and maximum optimization parameters and the signal characteristic value;
   determining whether the prime criterion parameter converges to a prescribed range;
      if the prime criterion parameter converges into the prescribed range then parsing measurement results from the circuit simulation, saving the current average optimization parameter, and ending the process;
      if the prime criterion parameter does not converge into the prescribed range;
   simulating the circuit based on the current optimization parameter;
   calculating a new signal characteristic value using the circuit simulation;
   determining the results of the circuit simulation based on the new signal characteristic value;
   setting the current average optimization parameter to a new optimization parameter in response to the new signal characteristic value;
   repeating the process of determining whether the prime criterion parameter converges into the prescribed range;
   wherein the height of the signal pulse is measured respectively for simulations based on the current minimum, current maximum and current average optimization parameters and wherein the current average optimization parameter is set to be the current minimum optimization parameter if both simulations based on current minimum and current average optimization parameters indicate the same status, either both succeed or both fail, otherwise the current average optimization parameter is set to be the current maximum optimization parameter.

4. The method of claim 3 where the succeed status is determined if the simulation result meets a user-prescribed limit and the height of the signal pulse is not greater than said user-prescribed limit, while the fail status is determined if the simulation result does not meet said user-prescribed limit or the height of the signal pulse is greater than said user-prescribed limit.

5. A method of performing a glitch check in simulating a circuit, the method comprising the following steps:
   determining current maximum and minimum values for an optimization parameter of the circuit;
   determining a signal characteristic value for circuit simulation based on the current maximum and minimum optimization parameters, said signal characteristic value being a slew time of a signal transition;
   determining a current average optimization parameter;
   calculating a prime criterion parameter based on the current minimum and maximum optimization parameters and the signal characteristic value;
   determining whether the prime criterion parameter converges to a prescribed range;
      if the prime criterion parameter converges into the prescribed range then parsing measurement results from the circuit simulation, saving the current average optimization parameter, and ending the process;
      if the prime criterion parameter does not converge into the prescribed range;
   simulating the circuit based on the current average optimization parameter;
   calculating a new signal characteristic value using the circuit simulation;
   determining the results of the circuit simulation based on the new signal characteristic value;
   setting the current average optimization parameter to a new optimization parameter in response to the new signal characteristic; and repeating the process of determining whether the prime criterion parameter converges into the prescribed range;

wherein for a meta-stability check the slew time of the signal transition is measured respectively for simulations based on the current minimum, current maximum and current average optimization parameters and wherein the current average optimization parameter is set to be the current minimum optimization parameter if both simulations based on current minimum and current o average optimization parameters indicate the same status, either both succeed or both fail, otherwise the current average optimization parameter is set to be the current maximum optimization parameter.

6. The method of claim 5 where the succeed status is determined if the simulation result meets a user-prescribed limit and the slew time of the signal transition is not greater than said user-prescribed limit, while the fail status is determined if the simulation result does not meet said user-prescribed limit or the slew time of the signal transition is greater than said user-prescribed limit.

7. A method for performing a glitch check on multiple nodes of a simulated circuit, the method comprising the following steps:

determining a current average optimization parameter from a maximum optimization parameter and a minimum optimization parameter of the circuit simulation;

calculating a prime criterion parameter based on the maximum and minimum optimization parameters;

determining whether the prime criterion parameter converges to a prescribed range;

if the prime criterion parameter converges into the prescribed range, then saving the current average optimization parameter as a setup and hold time for circuit simulation calculations and ending the process;

if the prime criterion parameter does not converge into the prescribed range;

simulating the circuit based on the current average optimization parameter;

calculating a current prime criterion parameter based on the circuit simulation;

measuring a secondary criterion parameter for all reference nodes;

setting the status of the current simulation to fail if the simulation result does not meet a user-prescribed limit or there is any value of the secondary criterion parameters of all reference nodes greater than the user-prescribed limit;

setting the status of the current simulation to succeed if the simulation result meets the user-prescribed limit and the values of the secondary criterion parameters of all the reference nodes are not greater than the user-prescribed limit; and repeating the process of determining whether the prime criterion parameter converges into the prescribed range.

8. The method of claim 7 wherein the prime criterion parameter is a bisection error of the circuit simulation.

9. The method of claim 7 wherein the process reiterates until the prime criterion parameter converges into the prescribed range.

10. The method of claim 7 wherein the secondary criterion parameter is the height of a signal pulse.

11. The method of claim 10 wherein the height of the signal pulse is measured within a specified measurement range centered by a clock transition.

12. The method of claim 7 wherein the current average optimization parameter is set to be the current minimum optimization parameter value when the current optimization parameter and the minimum optimization parameter indicate the same status.

13. The method of claim 7 wherein the current average optimization parameter is set to be the current maximum optimization parameter value when the current average optimization parameter and the minimum optimization parameter do not indicate the same status.

14. The method of claim 7 wherein for a meta-stability check the secondary criterion parameter is a metastable time.

15. The method of claim 14 wherein the metastable time is the time that a signal transition stays in a prescribed voltage range.

16. The method of claim 15 wherein the metastable time is measured within a specified measure range centered by a clock transition.

* * * * *